(12) United States Patent
Nagai et al.

(10) Patent No.: US 7,202,633 B2
(45) Date of Patent: Apr. 10, 2007

(54) DRIVING CIRCUIT FOR FIELD EFFECT TRANSISTOR

(75) Inventors: Tamiji Nagai, Kanagawa (JP); Kazuo Yamazaki, Kanagawa (JP); Kenji Enomoto, Saitama (JP); Takayuki Aita, Fukushima (JP)

(73) Assignee: Sony Corporation (JP)

( * ) Notice: Subject to any disclaimer, the term of this patent is extended or adjusted under 35 U.S.C. 154(b) by 429 days.

(21) Appl. No.: 10/874,244

(22) Filed: Jun. 24, 2004

(65) Prior Publication Data

US 2005/0116764 A1   Jun. 2, 2005

(30) Foreign Application Priority Data

Jun. 30, 2003 (JP) .......................... P2003-186657

(51) Int. Cl.
*H02J 7/10* (2006.01)
*H02J 7/04* (2006.01)
(52) U.S. Cl. ...................... 320/134; 320/136
(58) Field of Classification Search ............ 320/127, 320/128, 132, 134, 135, 136, 137
See application file for complete search history.

(56) References Cited

U.S. PATENT DOCUMENTS

| 5,789,902 A | * | 8/1998 | Abe et al. | 320/134 |
| 6,222,346 B1 | * | 4/2001 | Mori | 320/134 |
| 6,646,422 B2 | * | 11/2003 | Hogari et al. | 320/134 |
| 6,670,790 B2 | * | 12/2003 | Stellberger | 320/134 |

FOREIGN PATENT DOCUMENTS

JP   2003-079058   3/2003

* cited by examiner

*Primary Examiner*—Gary L Laxton
(74) *Attorney, Agent, or Firm*—Rader Fishman & Grauer PLLC; Ronald P. Kananen

(57) ABSTRACT

A driving circuit is disclosed. The driving circuit comprises a secondary battery cell having a positive electrode and a negative electrode, first and second N-type field effect transistors each having a gate, a drain, and a source, first and second switching devices, connected between the gates of the first and second N-type field effect transistors and the negative electrode side of the secondary battery cell, for turning on and off the first and second N-type field effect transistors, driving means for controlling the first and second switching devices, first and second output terminals, and a diode having an anode and a cathode.

2 Claims, 11 Drawing Sheets

DRIVING CIRCUIT FOR FIELD EFFECT TRANSISTOR

BACKGROUND OF THE INVENTION

1. Field of the Invention

The present invention relates to a driving circuit for N-type field effect transistors (FETs) suitably connected to a positive electrode side of a power supply circuit.

2. Description of the Related Art

In recent years, a secondary battery cell has been widely used for a power supply of an electronic appliance such as a note-type personal computer or a cellular phone. A protecting circuit is disposed in a secondary battery cell to prevent it from deteriorating and heating due to overcharging and over-current in a charging state and to prevent it from burning a current path due to over-current and deteriorating due to over-current in a discharging state.

For the protecting circuit, a P-type FET is used, although it is inferior to an N-type FET in characteristics because the former can be more easily controlled when it is disposed on the positive electrode side of the power supply than the latter.

As shown in FIG. 1, a discharge-control P-type FET 142 and a charge-control P-type FET 144 are disposed on a positive electrode side of a secondary battery cell 141. An NPN-type transistor 143 is connected to a gate of the FET 142 and a negative electrode side of the secondary battery cell 141. An NPN-type transistor 145 is connected to a gate of the FET 144 and the negative electrode side of the secondary battery cell 141. Bases of the transistor 143 and a transistor 145 are connected to a driving circuit 146. In such a manner, P-type FETs are used as a protecting circuit of a secondary battery cell.

A P-type FET is controlled by applying a voltage that is lower than the source voltage to the gate. In contrast, an N-type FET is controlled by applying a voltage that is higher than the source voltage to the gate. Thus, when an N-type FET that is superior to a P-type FET in characteristics is disposed to the positive electrode side of a secondary battery cell, a gate voltage necessary for controlling the N-type FET is generated by a charge pump so as to raise the battery voltage (refer to Patent Related Art Reference 1).

[Patent Related Art Reference 1] Japanese Patent Laid-Open Publication No. 2003-079058

As shown in FIG. 2, a discharge-control N-type FET 152 and a charge control N-type FET 154 are disposed on a positive electrode side of a secondary battery cell 141. A gate of the FET 152 is connected to a positive electrode side of a voltage source 156 through a resistor 153. A gate of the FET 154 is connected to the positive electrode side of the voltage source 156 through a resistor 155. A negative electrode side of the voltage source 156 is connected to a connection point of the FETs 152 and 154. The voltage source 156 is controlled by a charge-pump controlling circuit 157 that is controlled by a controlling circuit 158. In such a manner, N-type FETs are used as a protecting circuit of a secondary battery cell.

However, when the FET 152 and the FET 154 are controlled with the charge-pump circuit, the capacitance between the gate and the source of each of the FET 152 and the FET 154 becomes large. In other words, so-called virtual capacitors are formed. Thus, when the FET 152 and the FET 154 are used as switching circuits, their switching speeds become slow.

When the FET 152 and the FET 154 are turned off, electric charges stored in their virtual capacitors are discharged through the resistors 153 and 155. Thus, as shown in FIG. 3, gate voltages of the FETs 152 and 154 have their active periods. In other words, powers are generated temporarily in the FETs 152 and 154.

As shown in FIG. 4, a charge pump circuit 171 is composed of switching circuits 172, 174, 175, and 176, and a capacitor 173. The charge pump circuit 171 is controlled by a controlling circuit 168.

At that point, when the FETs 152 and 154 are turned off, after electric charges stored in the capacitor 173 are discharged to a resistor 177, gate voltages of the FETs 152 and 154 have their active periods as shown in FIG. 3. As described above, electric charges stored in the capacitor 173 are discharged by the resistor 177. Thus, powers are temporarily applied to the gates of the FETs 152 and 154. Consequently, switching operations for the FETs 152 and 154 become slow.

OBJECTS AND SUMMARY OF THE INVENTION

Therefore, an object of the present invention is to provide a driving circuit for field effect transistors using N-type FETs that are superior to P-type FETs in characteristics for a protecting circuit disposed on a positive electrode side of a secondary battery cell so as to turn off the FET without a delay.

The present invention is a driving circuit, comprising: a secondary battery cell having a positive electrode and a negative electrode; first and second N-type field effect transistors each having a gate, a drain, and a source; first and second switching devices, connected between the gates of the first and second N-type field effect transistors and the negative electrode side of the secondary battery cell, for turning on and off the first and second N-type field effect transistors; driving means for controlling the first and second switching devices; first and second output terminals; and a diode having an anode and a cathode; wherein the drain of the first N-type field effect transistor is connected to the positive electrode side of the secondary battery, wherein the source of the first N-type field effect transistor and the source of the second N-type field effect transistor are connected; wherein the drain of the second N-type field effect transistor is connected to the first output terminal, wherein the negative electrode side of the second battery cell is connected to the second output terminal; wherein a voltage source for supplying a gate voltage higher than a source voltage of the first and second N-type field effect transistors is connected between a connection point of the sources of the first and second N-type field effect transistors and the gates of the first and second N-type field effect transistors; wherein the cathode of the diode is connected to the negative electrode side of the voltage source; and wherein the anode of the diode is connected to the negative electrode side of the secondary battery cell.

When a diode is disposed between two N-type FETs disposed on a positive electrode side of a secondary battery cell, the diode as a drive power supply is capable of easily driving the N-type FETs.

These and other objects, features and advantages of the present invention will become more apparent in light of the following detailed description of a best mode embodiment thereof, as illustrated in the accompanying drawings.

BRIEF DESCRIPTION OF THE DRAWINGS

The invention will become more fully understood from the following detailed description, taken in conjunction with the accompanying drawing, wherein like reference numerals denote like elements, in which.

DETAILED DESCRIPTION OF THE PREFERRED EMBODIMENTS

Next, with reference to the accompanying drawings, embodiments of the present invention will be described.

First Embodiment

Figure 1:
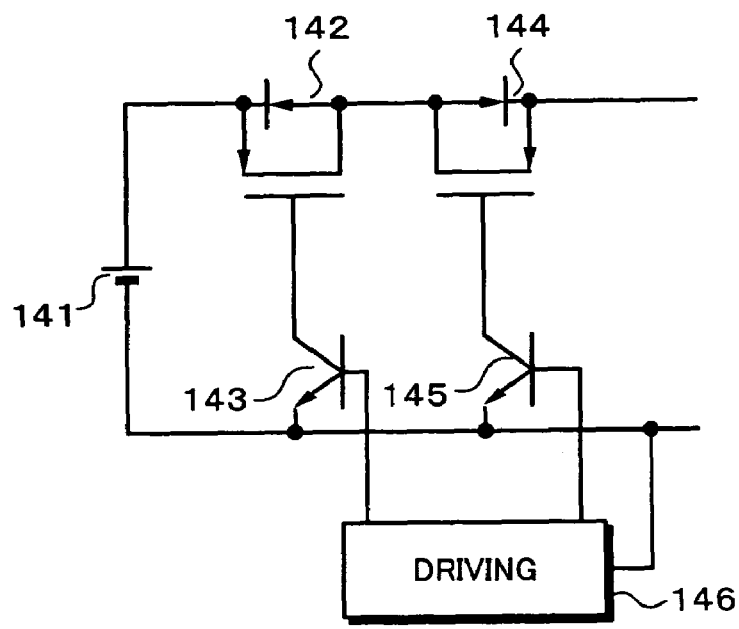
FIG. 1 is a circuit diagram describing a conventional protecting circuit using P-type FETs.
Figure 2:
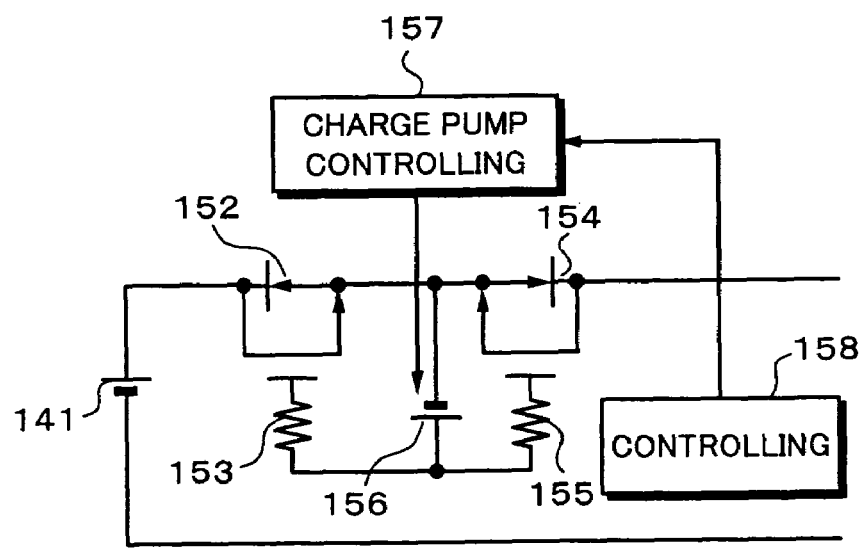
FIG. 2 is a circuit diagram describing a conventional protecting circuit using N-type FETs.
Figure 3:
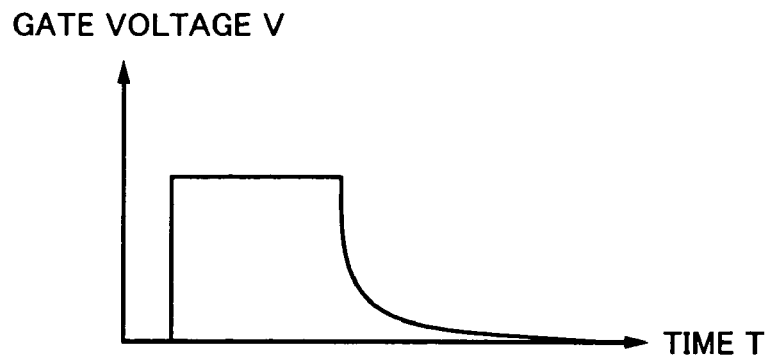
FIG. 3 is a characteristic diagram describing a conventional protecting circuit using N-type FETs.
Figure 4:
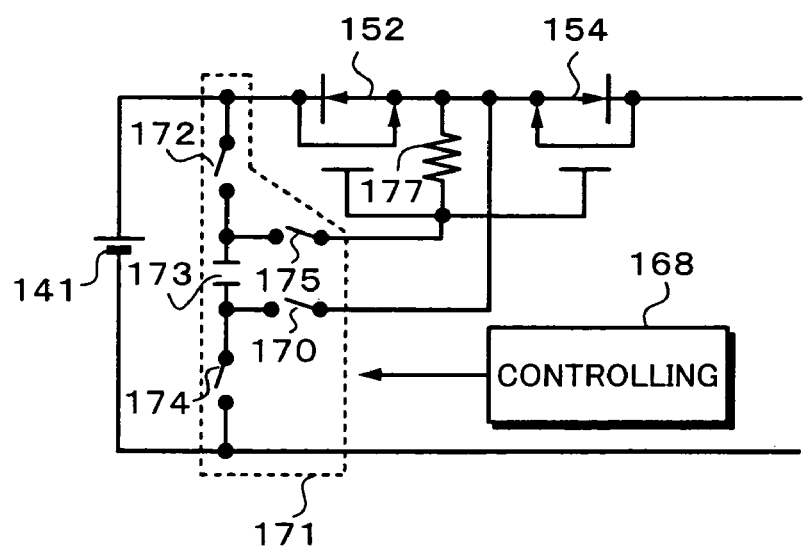
FIG. 4 is a circuit diagram describing a conventional protecting circuit using P-type FETs.
Figure 5:
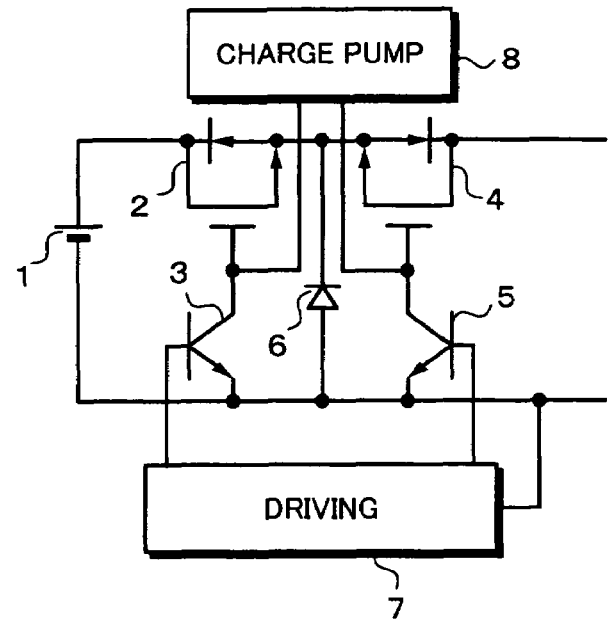
FIG. 5 is a circuit diagram describing a first embodiment of the present invention.

First of all, with reference to FIG. 5, a first embodiment of the present invention will be described. A drain of an N-type FET 2 (first field effect transistor) is connected to a positive electrode side of a secondary battery cell 1. A source of the FET 2 is connected to a source of an N-type FET 4 (second field effect transistor). A drain of the FET 2 is connected to one output terminal. A negative electrode side of the secondary battery cell 1 is connected to another output terminal. In such a manner, the FETs 2 and 4 are disposed on the positive electrode side of the secondary battery cell 1.

The FET 2 is a discharge-control FET. The FET 4 is a charge-control FET. Parasitic diodes are formed in the FETs 2 and 4. A collector of an NPN-type transistor 3 (first switching device) is connected to a gate of the FET 2. An emitter of the transistor 3 is connected to the negative electrode side of the secondary battery cell 1. A base of the transistor 3 is connected to a driving circuit 7.

A collector of an NPN-type transistor 5 (second switching device) is connected to a gate of the FET 4. An emitter of the transistor 5 is connected to the negative electrode side of the secondary battery cell 1. A base of the transistor 5 is connected to the driving circuit 7. In addition, the driving circuit 7 is connected to the negative electrode side of the secondary battery cell 1. A cathode of a diode 6 is connected to a connection point of the source of the FET 2 and the source of the FET 4. An anode of the diode 6 is connected to the negative electrode side of the secondary battery cell 1. The diode 6 is used to generate a gate voltage (drive power source) for the FETs 2 and 4. A charge pump circuit 8 is connected to the gates of the FETs 2 and 4.

In such a manner, the FETs 2 and 4 are connected to the positive electrode side of the power supply circuit. The driving circuit 7 is connected to the negative electrode side of the power supply circuit. When the diode 6 is disposed between the FETs 2 and 4, even if the battery voltage is applied to the FETs 2 and 4, they can be turned off. In addition, the FETs 2 and 4 are turned on and off by the transistors 3 and 5. The transistors 3 and 5 are turned on and off by the driving circuit 7.

According to the first embodiment, the gate voltage necessary for controlling the N-type FETs 2 and 4 is raised by the charge pump circuit 8 so that the gate voltage is higher than the voltage of the secondary battery cell 1.

The secondary battery cell 1 is a nonaqueous secondary battery cell, for example, a lithium ion secondary battery cell or a nickel hydrogen secondary battery cell.

Second Embodiment

Figure 6:
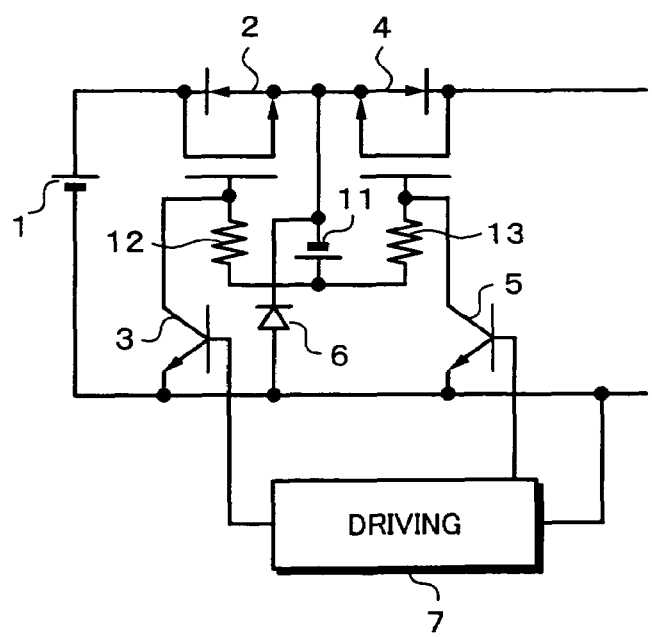
FIG. 6 is a circuit diagram describing a second embodiment of the present invention.

Next, with reference to FIG. 6, a second embodiment of the present invention will be described. Resistors 12 and 13 are connected in series between a gate of an FET 2 and a gate of an FET 4. A positive electrode side of a voltage source 11 is connected to a connection point of the resistors 12 and 13. A negative electrode side of the voltage source 11 is connected to a connection point of a source of the FET 2 and a source of the FET 4.

When a transistor 3 is turned on, since the gate and the source of the FET 2 are short-circuited, the FET 2 is turned off. At that point, since electric charges stored in a virtual capacitor formed between the gate and the source of the FET 2 are discharged, the FET 2 is immediately turned off.

Likewise, when a transistor 5 is turned on, since the gate and the source of the FET 4 are short-circuited through the diode 6, the FET 4 is turned off. At that point, since electric charges stored in a virtual capacitor formed between the gate and the source of the FET 4 are discharged, the FET 4 is turned off immediately.

For example, a charge pump circuit is used for a voltage source 11. The charge pump circuit is composed of a capacitor. However, the voltage source 11 is not limited to the charge pump circuit. As the voltage source 11, a substitute of the charge pump circuit may be used.

When the diode 6 is used, a driving circuit simply can be structured like P-type FETs.

Figure 7:
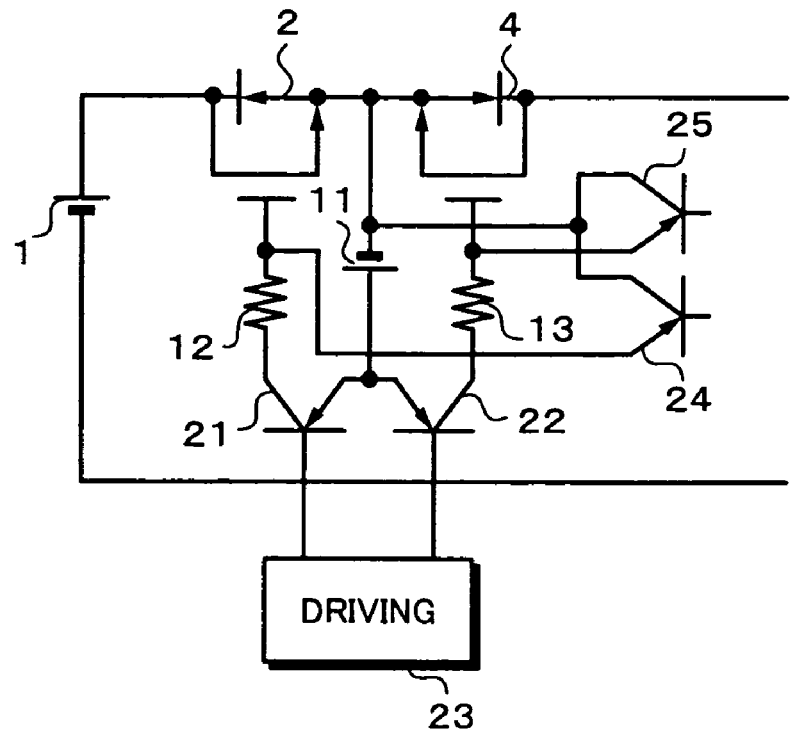
FIG. 7 is a circuit diagram describing the second embodiment of the present invention.

FIG. 7 shows an example of the driving circuit that does not use the diode 6. A collector of a PNP-type transistor 21 is connected to a gate of an FET 2 through a resistor 12. An emitter of the transistor 21 is connected to a positive electrode side of a voltage source 11. A base of the transistor 21 is connected to a driving circuit 23. A collector of a PNP-type transistor 22 is connected to a gate of an FET 4 through a resistor 13. An emitter of the transistor 22 is connected to the positive electrode side of the voltage source 11. A base of the transistor 22 is connected to the driving circuit 23. An emitter of a PNP-type transistor 24 is connected to the gate of the FET 2. A collector of the transistor 24 is connected to a negative electrode side of the voltage source 11. An emitter of a PNP-type transistor 25 is connected to the gate of the FET 4. A collector of the transistor 25 is connected to the negative electrode side of the voltage source 11.

Since the circuit shown in FIG. 7 does not use the diode 6, the transistors 21, 22, 24, and 25 cannot be controlled. This is because the power supply of the voltage source 11 is separated. Thus, there is no path through which these transistors are controlled. In the system for controlling the charge pump, a circuit that controls power supplies of FETs is required. According to the second embodiment, with one diode and one charge pump, N-type FETs can be controlled.

Figure 8:
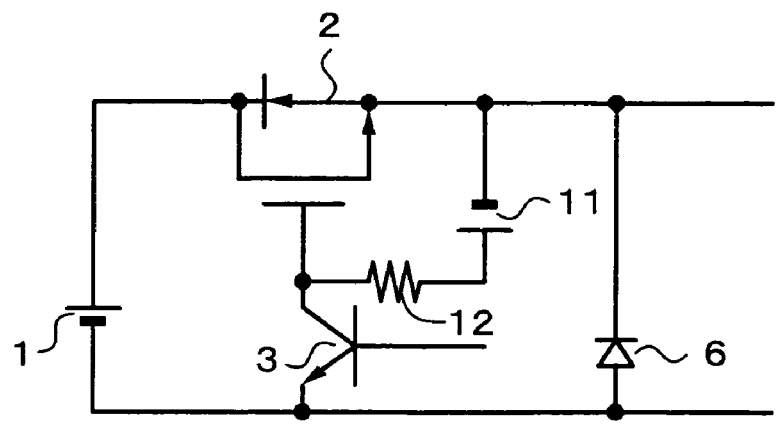
FIG. 8 is a circuit diagram describing an example of a charge control according to the second embodiment of the present invention.

Next, with reference to FIG. 8, according to the second embodiment, an example in which the discharge control FET 2 is controlled will be described. When the transistor 3 is turned on, the gate and the source of the FET 2 are short-circuited. As a result, the FET 2 can be turned off. At that point, even if the voltage of the secondary battery cell is applied to the FET 2, since the diode 6 is disposed, the FET 2 can be turned off.

Figure 10:
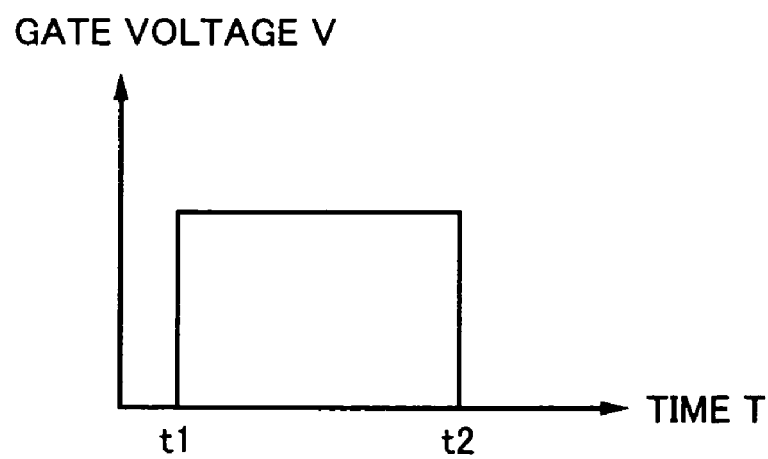
FIG. 10 is a characteristic diagram describing an embodiment of the present invention.

As described above, since electric charges stored in the virtual capacitor formed in the FET 2 cannot be discharged through the resistor 12, a gate voltage as shown in FIG. 10 is applied to the gate of the FET 2. When the transistor 3 is turned off at time t1, the FET 2 is turned off. When the transistor 3 is turned on at time t2, the FET 2 is turned off.

Figure 9:
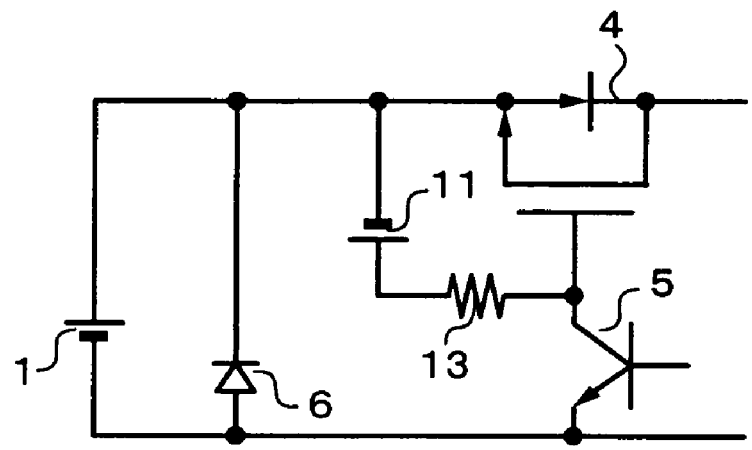
FIG. 9 is a circuit diagram describing an example of a discharge control according to the second embodiment of the present invention.

Next, with reference to FIG. 9, according to the second embodiment, an example of which the charge control FET 4 is controlled will be described. When the transistor 5 is turned on, the gate and the source of the FET 4 are short-circuited. As a result, the FET 4 can be turned off. At that point, even if the voltage of the secondary battery cell is applied to the FET 4, since the diode 6 is disposed, the FET 4 can be turned off.

As described above, since electric charges stored in the virtual capacitor formed in the FET 4 can be discharged not through the resistor 13, a gate voltage shown in FIG. 10 is applied to the gate of the FET 4. When the transistor 5 is turned off at time t1, the FET 4 is turned on. When the transistor 5 is turned on at time t2, the FET 4 is turned off.

Third Embodiment

Figure 11A:
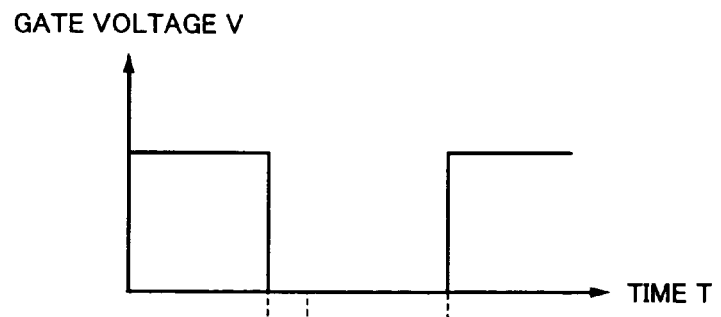
FIG. 11A and FIG. 11B are graphs showing characteristics of a third embodiment of the present invention.
Figure 11B:
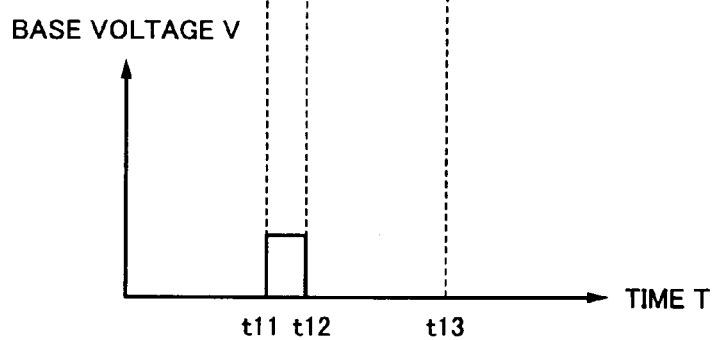

Next, a third embodiment of the present invention will be described. FIG. 11A shows characteristics of gate voltages applied to gates of FETs 2 and 4. FIG. 11B shows characteristics of base voltages applied to bases of transistors 3 and 5.

According to the third embodiment, when the transistors 3 and 5 are turned on at time t11, the FETs 2 and 4 are turned off. At that point, an operation of a charge pump also is stopped. After a time period ΔT elapses, at time t12, the transistors 3 and 5 are turned off. At time t13, the FETs 2 and 4 are turned on. At that point, the operation of the charge pump is started. As a result, when the FETs are turned off, voltages exceeding a gate withstand voltage can be prevented from being applied to the gates thereof.

Figure 12:
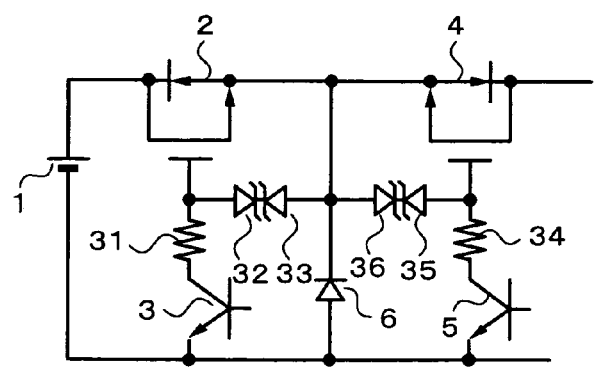
FIG. 12 is a circuit diagram describing the third embodiment of the present invention.

Next, with reference to FIG. 12, the third embodiment of the present invention will be described. A resistor 31 is disposed between a gate of the FET 2 and a collector of the transistor 3. An anode of a constant voltage diode 32 is connected to the gate of the FET 2. A cathode of the constant voltage diode 32 is connected to a cathode of a constant voltage diode 33. An anode of the constant voltage diode 33 is connected to a cathode of a diode 6.

A resistor 34 is disposed between the gate of the FET 4 and the collector of the transistor 5. An anode of a constant voltage diode 35 is connected to the gate of the FET 4. A cathode of the constant voltage diode 35 is connected to the cathode of the constant voltage diode 36. An anode of the constant voltage diode 36 is connected to the cathode of the diode 6.

In such a structure, as described above, when the transistor 3 is turned on, the FET 2 is turned off. When the transistor 3 is turned off, the FET 2 is kept off until a voltage applied to the constant voltage diode 32 exceeds a zener voltage thereof. When the voltage applied to the constant voltage diode 32 exceeds the zener voltage, the FET 2 is turned on. Likewise, when the transistor 5 is turned on, the FET 4 is turned off. When the transistor 5 is turned off, the FET 4 is kept off until a voltage applied to the constant voltage diode 35 exceeds the zener voltage thereof. When the voltage applied to the constant voltage diode 35 exceeds the zener voltage, the FET 4 is turned on.

First Modification of First Embodiment

Figure 13:
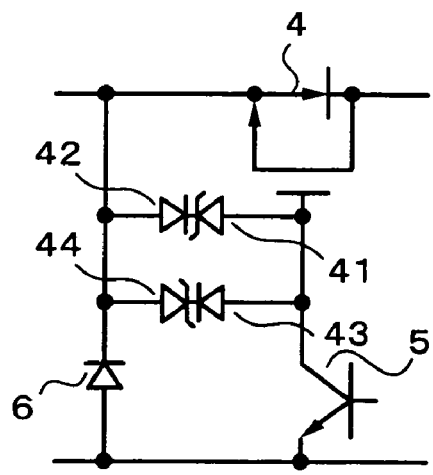
FIG. 13 is a circuit diagram describing a first modification of the third embodiment of the present invention.

Next, with reference to FIG. 13, a first modification of the third embodiment of the present invention will be described. An anode of a constant voltage diode 41 is connected to the gate of the FET 4. A cathode of the constant voltage diode 41 is connected to a cathode of a diode 42. An anode of the diode 42 is connected to the cathode of the diode 6.

An anode of a diode 43 is connected to the gate of the FET 4. A cathode of the diode 43 is connected to a cathode of a constant voltage diode 44. An anode of the constant voltage diode 44 is connected to the cathode of the diode 6. The gate of the FET 4 is connected to the collector of the transistor 5.

According to the first modification of the third embodiment, when the transistor 5 is turned on, the FET 4 is turned off. When the transistor 5 is turned on, the FET 4 is kept off until a voltage applied to the constant voltage diode 41 exceeds the zener voltage thereof. When the voltage applied to the constant voltage diode 41 exceeds the zener voltage, the FET 2 is turned on.

Second Modification of Third Embodiment

Figure 14:
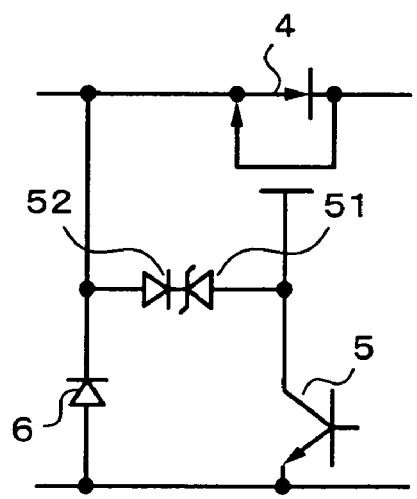
FIG. 14 is a circuit diagram describing a second modification of the third embodiment of the present invention.

Next, with reference to FIG. 14, a second modification of the third embodiment will be described. An anode of a constant voltage diode 51 is connected to the gate of the FET 4. A cathode of the constant voltage diode 51 is connected to a cathode of a diode 52. An anode of the diode 52 is connected to the cathode of the diode 6. The gate of the FET 4 is connected to the collector of the transistor 5.

In the circuit structures according to the third embodiment, the first modification thereof, and the second modification thereof, an over-voltage resisting circuit disposed between the gate and the source of each of the FETs 2 and 4 can be omitted.

According to the second modification of the third embodiment, when the transistor 5 is turned on, the FET 4 is turned off. When the transistor 5 is turned off, until a voltage applied to the constant voltage diode 51 exceeds the zener voltage thereof, the FET 4 is kept off. When the voltage applied to the constant voltage diode 51 exceeds the zener voltage, the FET 4 is turned on.

Third Modification of Third Embodiment

Figure 15:
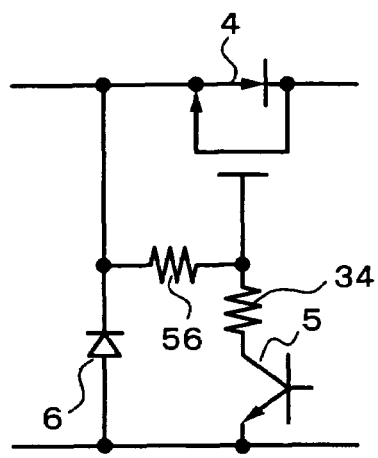
FIG. 15 is a circuit diagram describing a third modification of the third embodiment of the present invention.

Next, with reference to FIG. 15, a third modification of the third embodiment of the present invention will be described. A resistor 56 is disposed between the gate of the FET 4 and the cathode of the diode 6.

According to the third modification of the third embodiment, when the terminal voltage of the secondary battery cell 1 becomes high, the terminal voltage is controlled by selecting a resistor 34 and the resistor 56 and varying an ON period of the transistor 5, namely a pulse width.

Fourth Embodiment

Figure 16:
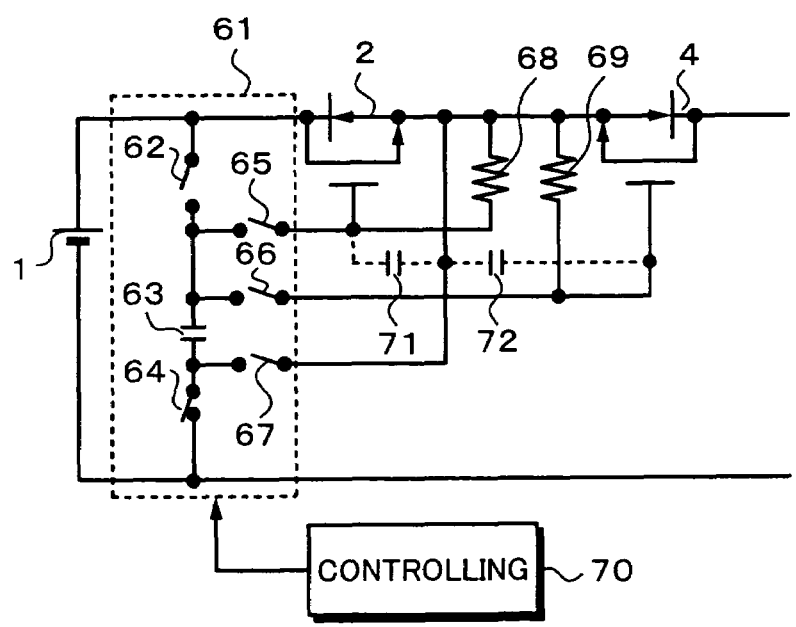
FIG. 16 is a circuit diagram describing a fourth embodiment of the present invention.

Next, with reference to FIG. 16, a fourth embodiment of the present invention will be described. A charge pump circuit 61 is composed of switching circuits 62, 64, 65, 66, and 67 and a capacitor 63. The charge pump circuit 61 is controlled by a controlling circuit 70.

The switching circuits 62 and 64 and the capacitor 63 are connected in series and disposed in parallel with a secondary battery cell 1. The switching circuit 65 is disposed between a connection point of the switching circuit 62 and the capacitor 63 and a gate of an FET 2. The switching circuit 66 is disposed between a connection point of the switching circuit 62 and the capacitor 63 and a gate of the FET 4. The switching circuit 67 is disposed between a connection point of the capacitor 63 and the switching circuit 64 and a source of the FET 2.

A resistor 68 is disposed between the source and the gate of the FET 2. A virtual capacitor 71 is formed between the gate and the source of the FET 2. The virtual capacitor 71 has a large capacitance. A resistor 69 is disposed between the source and the gate of the FET 4. A virtual capacitor 72 is formed between the gate and the source of the FET 4. The virtual capacitor 72 has a large capacitance.

When the virtual capacitor 71 is charged, the switching circuits 62 and 64 are turned on. As a result, the capacitor 63 is charged. Thereafter, the switching circuits 62 and 64 are turned off. The switching circuits 65 and 67 are turned on. Thus, the virtual capacitor 71 is charged with electric charges stored in the capacitor 63.

Likewise, when the virtual capacitor 72 is charged, the switching circuits 62 and 64 are turned on. As a result, the capacitor 63 is charged. Thereafter, the switching circuits 62 and 64 are turned off. As a result, the switching circuits 66 and 67 are turned on. Thus, the virtual capacitor 72 is charged with electric charges stored in the capacitor 63.

In such a manner, the virtual capacitors 71 and 72 are charged separately by the charge pump circuit 61. At that point, even if the resistances of resistors 68 and 69 are high, as shown in FIG. 10, the FETs 2 and 4 can be turned off.

Fifth Embodiment

Figure 17:
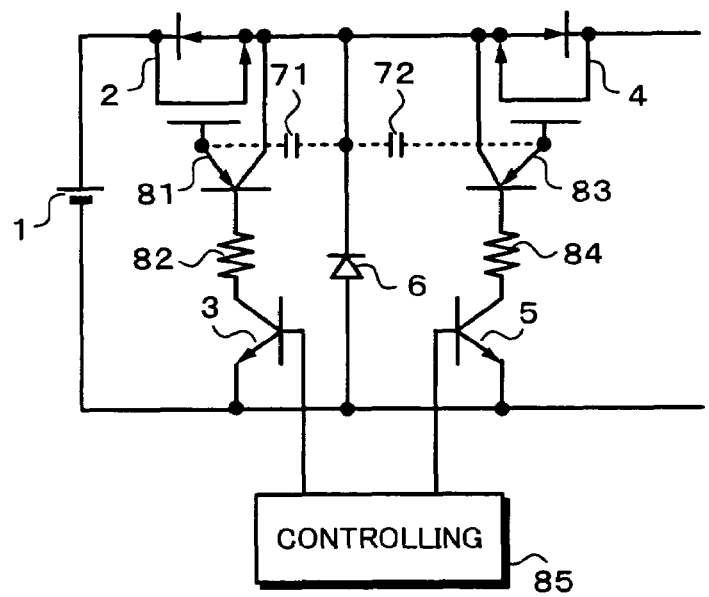
FIG. 17 is a circuit diagram describing a fifth embodiment of the present invention.

Next, with reference to FIG. 17, a fifth aspect of the present invention will be described. An emitter of a PNP-type transistor 81 is connected to a gate of an FET 2. A collector of the transistor 81 is connected to a source of the FET 2. A base of the transistor 81 is connected to a collector of a transistor 3 through a resistor 82. An emitter of a PNP-type transistor 83 is connected to a gate of an FET 4. A collector of the transistor 83 is connected to a source of the FET 4. A base of the transistor 83 is connected to a collector of a transistor 5 through a resistor 84. The transistors 3 and 5 are controlled by a controlling circuit 85.

When the transistor 3 is turned on by the controlling circuit 85, a base current of the transistor 81 flows to a virtual capacitor 71, the transistor 81, the resistor 82, the transistor 3, and the diode 6, in that order. As a result, the base current causes the transistor 81 to be turned on. When the transistor 81 is turned on, electric charges stored in the virtual capacitor 71 are discharged. As a result, the FET 2 is turned off.

Likewise, when the transistor 5 is turned on by the controlling circuit 85, a base current of the transistor 83 flows to the virtual capacitor 72, the transistor 83, the resistor 84, the transistor 5, and the diode 6, in that order. As a result, the transistor 83 is turned on. When the transistor 83 is turned on, electric charges stored in the virtual capacitor 72 are discharged. As a result, the FET 4 is turned off.

According to the fifth embodiment, the transistors 81 and 83 are driven by the diode 6.

Sixth Embodiment

Figure 18:
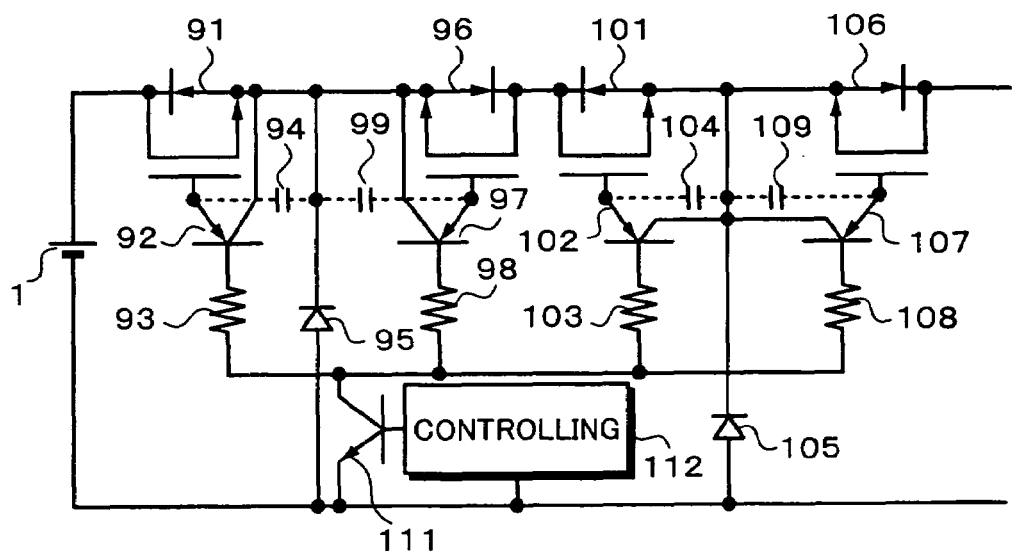
FIG. 18 is a circuit diagram describing a sixth embodiment of the present invention.

Next, with reference to FIG. 18, a sixth embodiment according to the present invention will be described. A drain of an N-type FET 91 is connected to a positive electrode side of a secondary battery cell 1. A source of the FET 91 is connected to a source of an N-type FET 96. A drain of an N-type FET 101 is connected to a drain of the FET 96. A source of the FET 101 is connected to a source of an N-type FET 106. In such a manner, the FETs 91, 96, 101, and 106 are disposed on the positive electrode side of the secondary battery cell 1.

An emitter of a PNP-type transistor 92 is connected to a gate of the FET 91. A collector of the transistor 92 is connected to the source of the FET 91. A base of the transistor 92 is connected to a collector of an NPN-type transistor 111 through a resistor 93. A virtual capacitor 94 is formed between the gate and the source of the FET 91. A cathode of a diode 95 is connected to the source of the FET 91. An anode of the diode 95 is connected to a negative electrode side of the secondary battery cell 1.

An emitter of a PNP-type transistor 97 is connected to a gate of the FET 96. A collector of the transistor 97 is connected to the source of the FET 96. A base of the transistor 97 is connected to the collector of the transistor 111 through a resistor 98. A virtual capacitor 99 is disposed between the gate and the source of the FET 96.

An emitter of a PNP transistor 102 is connected to a gate of the FET 101. A collector of the transistor 102 is connected to the source of the FET 101. A base of the transistor 102 is connected to the collector of the transistor 111. A virtual capacitor 104 is formed between the gate and the source of the FET 101. A cathode of a diode 105 is connected to the source of the FET 101. An anode of the diode 105 is connected to the negative electrode side of the secondary battery cell 1.

A emitter of a PNP-type transistor 107 is connected to a gate of the FET 106. A collector of the transistor 107 is connected to the source of the FET 106. A base of the transistor 107 is connected to the collector of the transistor 111 through a resistor 108. A virtual capacitor 109 is formed between the gate and the source of the FET 106.

An emitter of the transistor 111 is connected to the negative electrode side of the secondary battery cell 1. A base of the transistor 111 is connected to a controlling circuit 112. The controlling circuit 112 also is connected to the negative electrode side of the secondary battery cell 1.

According to the sixth embodiment of the present invention, when the transistor 111 is turned on by the controlling circuit 112, a base current of the transistor 92 flows to the virtual capacitor 94, the transistor 92, the resistor 93, the transistor 111, and the diode 95, in that order. As a result, the transistor 92 is turned on. When the transistor 92 is turned on, electric charges stored in the resistor 93 are discharged. As a result, the FET 91 is turned off.

When the transistor 111 is turned on by the controlling circuit 112, a base current of the transistor 97 flows to the virtual capacitor 99, the transistor 97, the resistor 98, the transistor 111, and the diode 95, in that order. As a result, the transistor 97 is turned on. When the transistor 97 is turned on, electric charges stored in the virtual capacitor 99 are discharged. As a result, the FET 96 is turned off.

Likewise, when the transistor 111 is turned on by the controlling circuit 112, a base current of the transistor 102 flows to the virtual capacitor 104, the transistor 102, the resistor 103, the transistor 111, and the diode 105, in that order. As a result, the transistor 102 is turned on. When the transistor 102 is turned on, electric charges stored in the virtual capacitor 104 are discharged. As a result, the FET 101 is turned off.

When the transistor 111 is turned on by the controlling circuit 112, a base current of the transistor 107 flows to the virtual capacitor 109, the transistor 107, the resistor 108, the transistor 111, and the diode 105, in that order. As a result, the transistor 107 is turned on. When the transistor 107 is turned on, electric charges stored in the virtual capacitor 109 are discharged. As a result, the FET 106 is turned off. In such a manner, when the transistor 111 is turned on, the FETs 91, 96, 101, and 106 are turned off.

Modification of Sixth Embodiment

Figure 19:
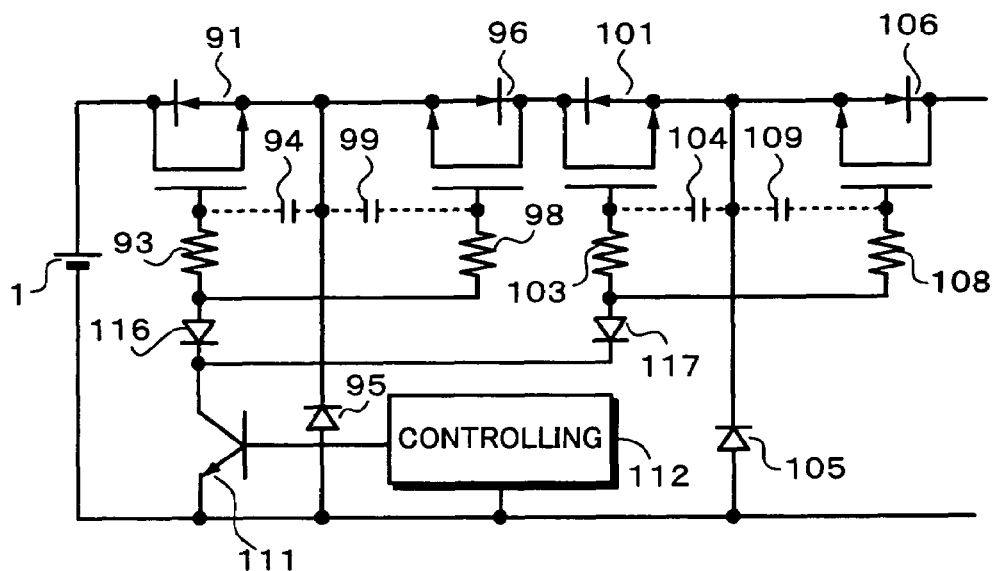
FIG. 19 is a circuit diagram describing a modification of the sixth embodiment of the present invention.

Next, with reference to FIG. 19, a modification of the sixth embodiment of the present invention will be described. According to the modification of the sixth embodiment, the transistors 92, 97, 102, and 107 are removed from the circuit according to the sixth embodiment. Instead, diodes 116 and 117 are disposed in the resultant circuit. An anode of the diode 116 is connected to the gate of the FET 91 through the resistor 93 and the gate of the FET 96 through the resistor 98. A cathode of the diode 116 is connected to the collector of the transistor 111. An anode of the diode 117 is connected to the gate of the FET 101 through the resistor 103 and the gate of the FET 106 through the resistor 108. A cathode of the diode 117 is connected to the collector of the transistor 111.

The diodes 116 and 117 are used to separate the FETs 91 and 96 and the FETs 101 and 106, respectively. The modification of the sixth embodiment operates in the same manner as the sixth embodiment. In other words, when the transistor 111 is turned on, the FETs 91, 96, 101, and 106 are turned off.

Seventh Embodiment

Figure 20:
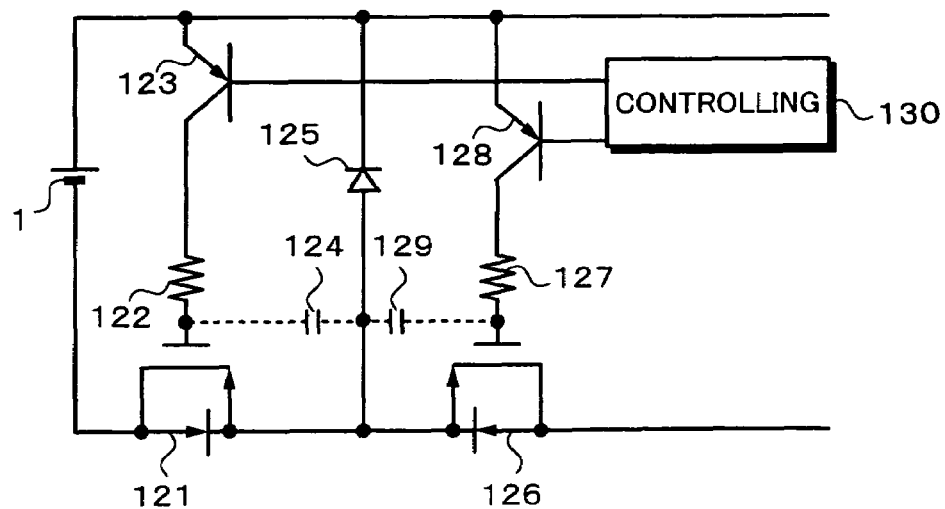
FIG. 20 is a circuit diagram describing a seventh embodiment of the present invention.

Next, with reference to FIG. 20, a seventh embodiment of the present invention will be described. Like the foregoing embodiments, according to the seventh embodiment, a diode is disposed between a charge-control P-type FET and a discharge-control P-type FET. A drain of a P-type FET 121 is connected to a negative electrode side of a secondary battery cell 1. A source of the FET 121 is connected to a source of a P-type FET 126. A gate of the FET 121 is connected to a collector of a PNP-type transistor 123. A virtual capacitor 124 is formed between the gate and the source of the FET 121.

The gate of the FET 126 is connected to a collector of a PNP-type transistor 128 through a resistor 127. A virtual capacitor 129 is formed between the gate and the source of the FET 126. In such a manner, the FETs 121 and 126 are disposed on the negative electrode side of the secondary battery cell 1.

An emitter of the transistor 123 is connected to a positive electrode side of the secondary battery cell 1. A base of the transistor 123 is connected to a controlling circuit 130. An emitter of the transistor 128 is connected to the positive electrode side of the secondary battery cell 1. A base of the transistor 128 is connected to the controlling circuit 130. An anode of a diode 125 is connected to the source of the FET 121. A cathode of the diode 125 is connected to the positive electrode side of the secondary battery cell 1.

According to the seventh embodiment, even if a diode is disposed, the P-type FETs can be controlled in the same manner as the N-type FETs.

Figure 21:
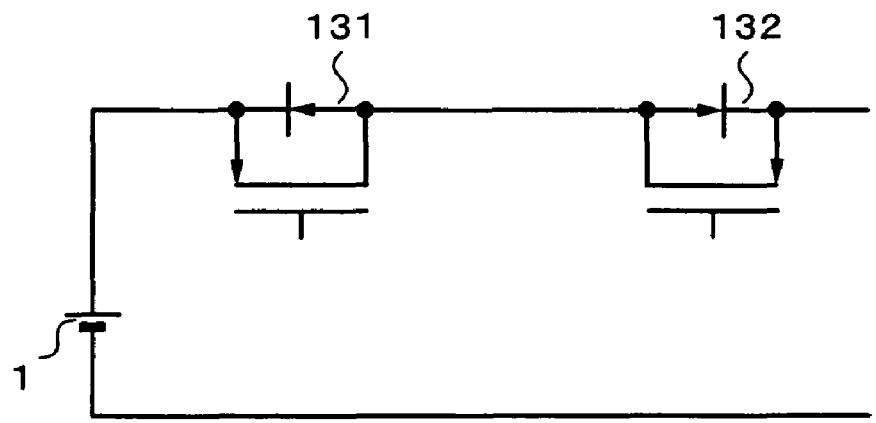
FIG. 21 is a circuit diagram describing a conventional protecting circuit using P-type FETs.

As shown in FIG. 21, a discharge control P-type FET 131 and a charge control P-type FET 132 are disposed on a positive electrode side of a secondary battery cell 1. However, when a diode is disposed as described in the foregoing embodiment, N-type FETs can be used in the same arrangement as P-type FETs.

Figure 22:
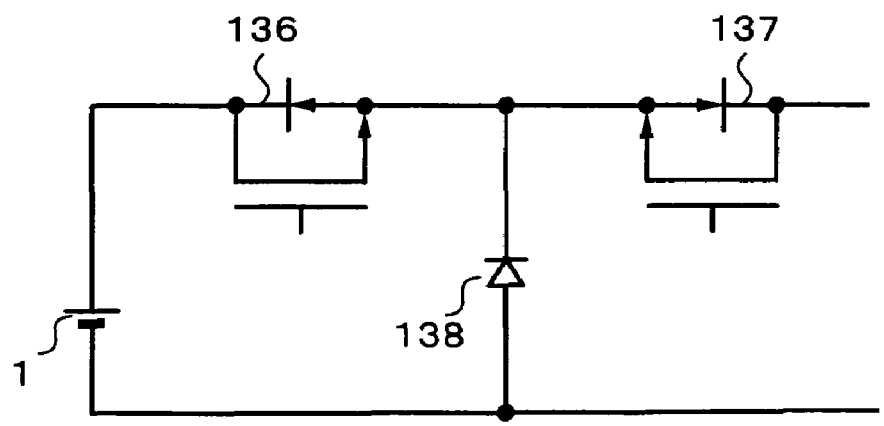
FIG. 22 is a circuit diagram describing an embodiment of the present invention.

As shown in FIG. 22, a drain of an N-type FET 136 is connected to a positive electrode side of a secondary battery cell 1. A source of the FET 136 is connected to a source of an N-type FET 137. A cathode of a diode 138 is connected to the source of the FET 136. An anode of the diode 138 is connected to a negative electrode side of the secondary battery cell 1. Thus, when the diode 138 is used, the N-type FET 136 and the N-type FET 137 can be used in the same arrangement as the discharge-control P-type FET 131 and the charge-control P-type FET 132.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

According to the present invention, with a diode, a protecting circuit can be structured with N-type FETs that are superior to P-type FETs in characteristics. In addition, with a diode, electric charges stored in virtual capacitors formed between the gate and source of each FET cannot be discharged through a resistor.

What is claimed is:

1. A driving circuit, comprising:
   a secondary battery cell having a positive electrode and a negative electrode;
   first and second N-type field effect transistors each having a gate, a drain, and a source;
   first and second switching devices, connected between the gates of the first and second N-type field effect transistors and the negative electrode side of the secondary battery cell, for turning on and off the first and second N-type field effect transistors;
   driving means for controlling the first and second switching devices;

first and second output terminals; and a diode having an anode and a cathode;

wherein the drain of the first N-type field effect transistor is connected to the positive electrode side of the secondary battery;

wherein the source of the first N-type field effect transistor and the source of the second N-type field effect transistor are connected;

wherein the drain of the second N-type field effect transistor is connected to the first output terminal;

wherein the negative electrode side of the second battery cell is connected to the second output terminal;

wherein a voltage source for supplying a gate voltage higher than a source voltage of the first and second N-type field effect transistors is connected between a connection point of the sources of the first and second N-type field effect transistors and the gates of the first and second N-type field effect transistors;

wherein the cathode of the diode is connected to the negative electrode side of the voltage source; and wherein the anode of the diode is connected to the negative electrode side of the secondary battery cell.

2. The driving circuit as set forth in claim 1, wherein the voltage source is a charge pump.

* * * * *